(12) United States Patent
Huang et al.

(10) Patent No.: US 10,462,902 B1
(45) Date of Patent: Oct. 29, 2019

(54) CIRCUIT BOARD AND MANUFACTURING METHOD

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Han-Pei Huang, Hsinchu (TW); Lin-Jie Gao, Shenzhen (CN); Yong-Quan Yang, Qinhuangdao (CN); Yong-Chao Wei, Qinhuangdao (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 16/381,264

(22) Filed: Apr. 11, 2019

(30) Foreign Application Priority Data

Jan. 25, 2019 (CN) .......................... 2019 1 0075253

(51) Int. Cl.
*H05K 1/11* (2006.01)
*H05K 3/00* (2006.01)
*H05K 1/02* (2006.01)
*H05K 3/40* (2006.01)
*H05K 3/46* (2006.01)
*H05K 5/00* (2006.01)

(52) U.S. Cl.
CPC ........... *H05K 1/115* (2013.01); *H05K 1/0298* (2013.01); *H05K 3/4038* (2013.01); *H05K 3/4611* (2013.01); *H05K 5/0017* (2013.01)

(58) Field of Classification Search
CPC .......... H05K 1/11; H05K 1/111; H05K 1/112; H05K 1/113; H05K 1/114; H05K 1/115; H05K 1/116; H05K 1/117; H05K 1/118; H05K 1/119; H05K 3/0071; H05K 3/0026; H05K 3/0029; H05K 3/0032; H05K 3/0035; H05K 3/0038
See application file for complete search history.

(56) References Cited

U.S. PATENT DOCUMENTS

2011/0088928 A1* 4/2011 Lim ..................... H05K 1/0262
174/252
2017/0339783 A1* 11/2017 Stahr ................... H01L 23/5383

* cited by examiner

*Primary Examiner* — Jeremy C Norris
(74) *Attorney, Agent, or Firm* — ScienBiziP, P.C.

(57) ABSTRACT

A circuit board includes at least two circuit board units. Each of the circuit board units includes a baseboard having a conductive hole filled with an electrical conductor, and a cover layer arranged on the baseboard and defining at least one trench and at least one opening. The at least one opening exposes out the electrical conductor. A circuit pattern is embedded in the at least one trench and includes a connecting portion. The connecting portion is embedded in the opening and is electrically coupled to the electrical conductor. The at least two circuit board units are stacked. Two sides of the at least one cover layer are respectively adhered to the corresponding baseboard. Two ends of the at least one connecting portion are respectively electrically coupled to the corresponding electrical conductor and electrically coupled the two adjacent circuit patterns.

9 Claims, 4 Drawing Sheets

CIRCUIT BOARD AND MANUFACTURING METHOD

FIELD

The subject matter herein generally relates to circuit boards, and more particularly to a manufacturing method of a circuit board.

BACKGROUND

Generally, in a manufacturing process of a circuit board, a seed layer is formed on a substrate, and circuits are formed on the seed layer. After the circuits are formed, excess seed layer is removed. Such a process has many steps and is not environmentally friendly.

BRIEF DESCRIPTION OF THE DRAWINGS

Implementations of the present disclosure will now be described, by way of embodiments, with reference to the attached FIGS.

DETAILED DESCRIPTION

Figure 1:
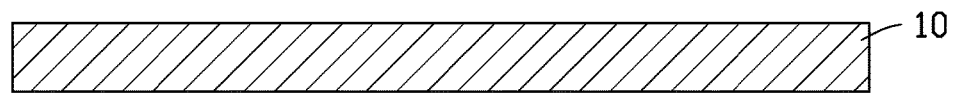
FIG. 1 is a cross-sectional view of a baseboard.

It will be appreciated that for simplicity and clarity of illustration, where appropriate, reference numerals have been repeated among the different FIGS. to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIGS. 1-12 show an embodiment of a method of manufacturing a circuit board.

Figure 2:
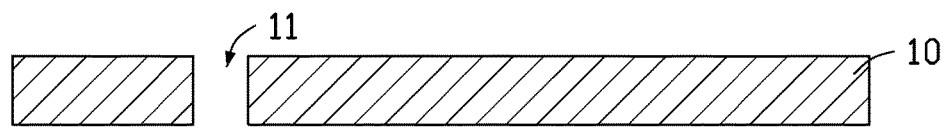
FIG. 2 is a cross-sectional view showing a through hole defined in the baseboard shown in FIG. 1.

Referring to FIG. 1 and FIG. 2, a baseboard 10 is provided, and a through hole 11 is defined in the baseboard 10.

In one embodiment, the baseboard 10 is a thermoplastic resin substrate, which may be selected from, but is not limited to, polyimide (PI), polyamide imide (PAI), polyether ether ketone (PEEK), liquid crystal polymer (LCP), polyethylene terephthalate (PET), and polyethylene naphthalate (PEN).

In one embodiment, the through hole 11 is defined by laser processing. In other embodiments, the through hole 11 may be defined by machining.

Figure 3:
FIG. 3 is a cross-sectional view of the through hole in FIG. 2 filled with an electrical conductor.

Referring to FIG. 3, the through hole 11 is filled with an electrical conductor 111 to form a conductive hole 12.

Figure 4:
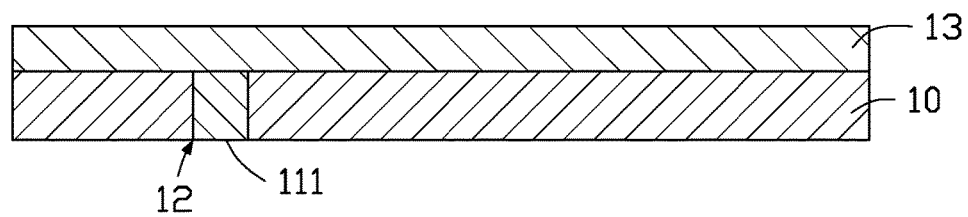
FIG. 4 is a cross-sectional view showing a cover layer formed on the baseboard shown in FIG. 3.

Referring to FIG. 4, a cover layer 13 is covered on one side of the baseboard 10. The cover layer 13 includes a laser direct structuring (LDS) additive.

In one embodiment, the cover layer 13 is formed on the baseboard 10 by coating and is bonded to the baseboard 10 by ultraviolet curing or thermal curing. In one embodiment, the cover layer 13 is a thermoplastic polyimide, but is not limited thereto. In other embodiments, the cover layer 13 may be other thermoplastic resins.

The LDS additive may be one or more metal oxides such as copper chromium oxide spinel, copper salt, copper hydroxide phosphate, copper phosphate, copper sulphate, metal oxide containing zinc, metal oxide containing copper, metal oxide containing silver, metal oxide containing gold, metal oxide containing aluminum.

Figure 5:
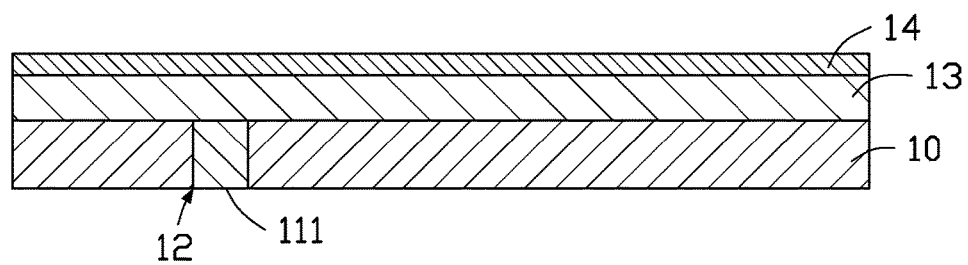
FIG. 5 is a cross-sectional view of the cover layer of FIG. 4 bonded to a separation film.

Referring to FIG. 5, a separation film 14 is adhered to the cover layer 13.

In one embodiment, the separation film 14 is made of polyethylene terephthalate, but is not limited thereto.

Figure 6:
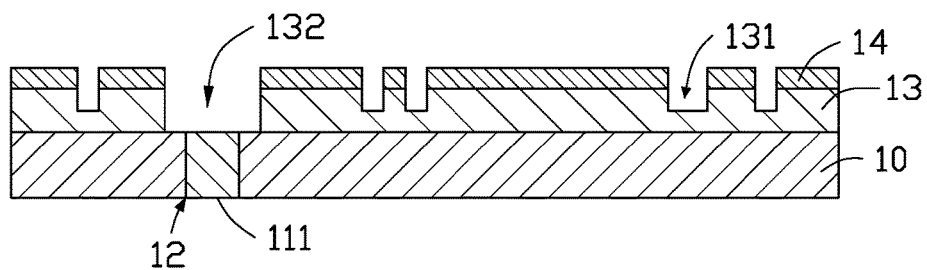
FIG. 6 is a cross-sectional view showing trenches and a opening defined in the separation film and the cover layer in FIG. 5.

Referring to FIG. 6, portions of the separation film 14 and the cover layer 13 are removed by laser ablation, thereby defining trenches 131 and a opening 132.

The trenches 131 do not penetrate the cover layer 13. The shape of the trenches 131 corresponds to the shape of a preset circuit pattern. The opening 132 extends to the electrical conductor 111 and the baseboard 10.

The LDS additive in the cover layer 13 is activated by laser irradiation at a wall and bottom surface of the groove 131 and a wall of the opening 132 to form rough surfaces embedded with metal particles. The surfaces embedded with the metal particles are capable of forming a metal layer in a subsequent electroplating process to form a circuit. The depth and width of the trenches 131 can be set according to the thickness and width of the required circuit.

Figure 7:
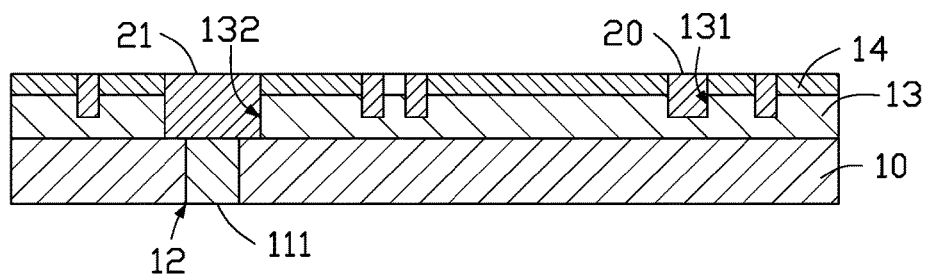
FIG. 7 is a cross-sectional view showing a conductive circuit pattern and a connecting portion formed in the trenches and the opening in FIG. 6.

Referring to FIG. 7, a conductive circuit pattern 20 and a connecting portion 21 are respectively formed in the trenches 131 and the opening 132 by plating or electroplating. In other embodiments, the conductive circuit pattern 20 and the connecting portion 21 may be formed by other means.

The connecting portion 21 is electrically coupled to the conductive circuit pattern 20 and the electrical conductor 111.

Figure 8:
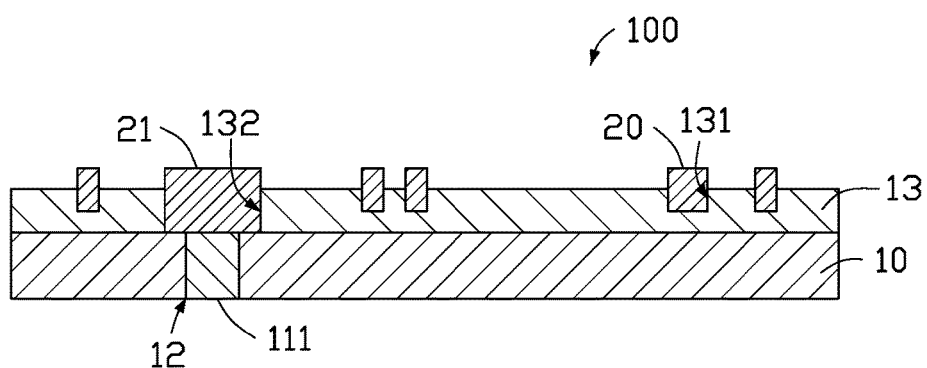
FIG. 8 is a cross-sectional view of a circuit board unit obtained after the separation film shown in FIG. 7 is removed.

Referring to FIG. 8, the separation film 14 is removed to form a circuit board unit 100.

After the separation film 14 is removed, the conductive circuit pattern 20 is partially embedded in the cover layer 13 and partially extends out of the cover layer 13.

Figure 9:
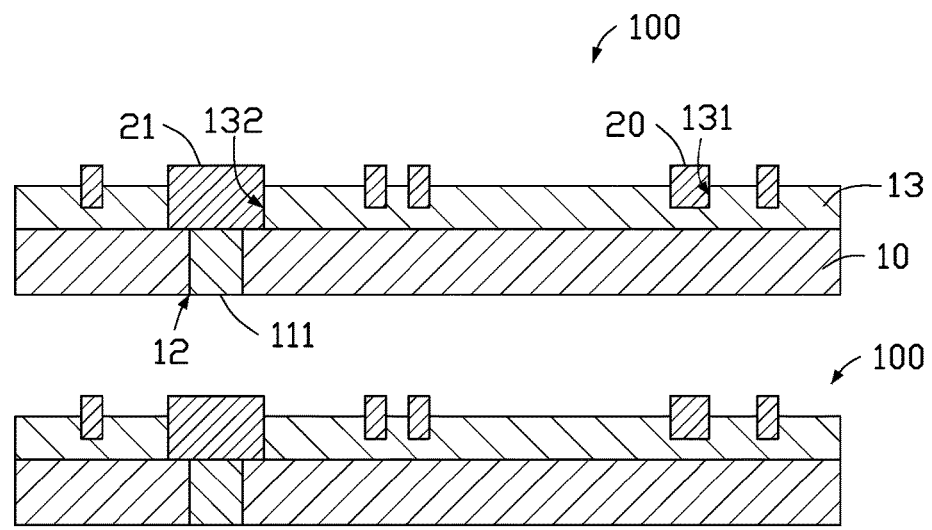
FIG. 9 is a cross-sectional view showing two circuit board units of FIG. 8.

Referring to FIG. 9, a second circuit board unit 100 is formed according to the above-describe process.

Figure 10:
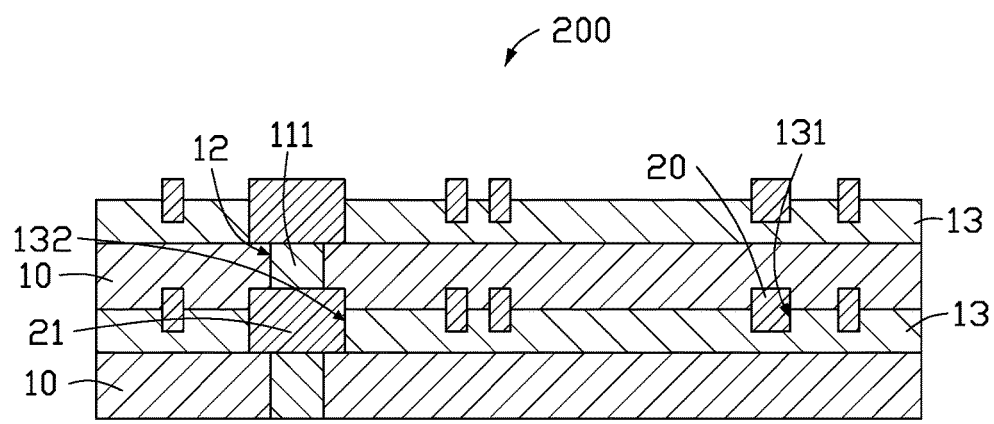
FIG. 10 is a cross-sectional view of a circuit board obtained by stacking and laminating the two circuit board units of FIG. 9 together.

Referring to FIG. 10, the two circuit board units 100 are laminated together to obtain a circuit board 200.

Figure 11:
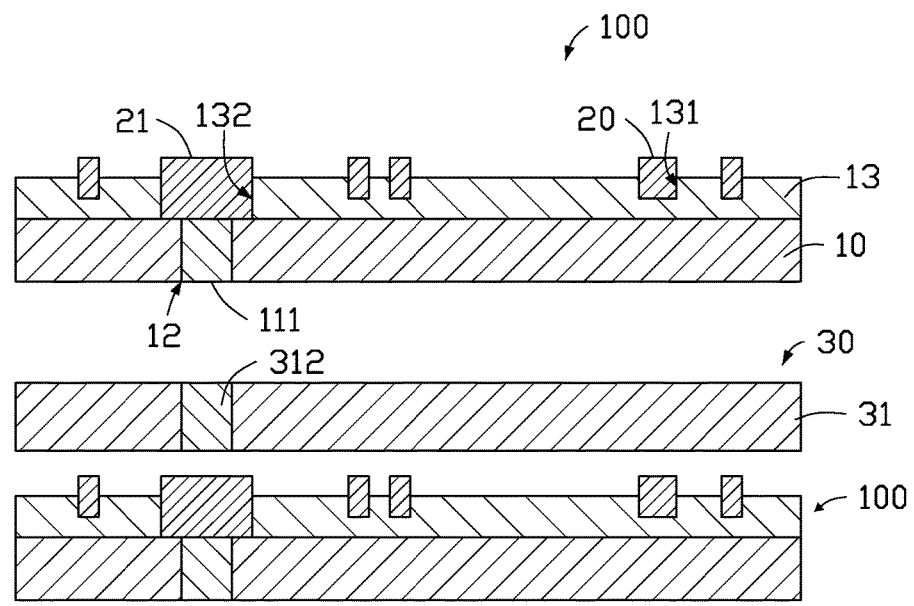
FIG. 11 is a cross-sectional view showing two circuit board units and an intermediate layer.
Figure 12:
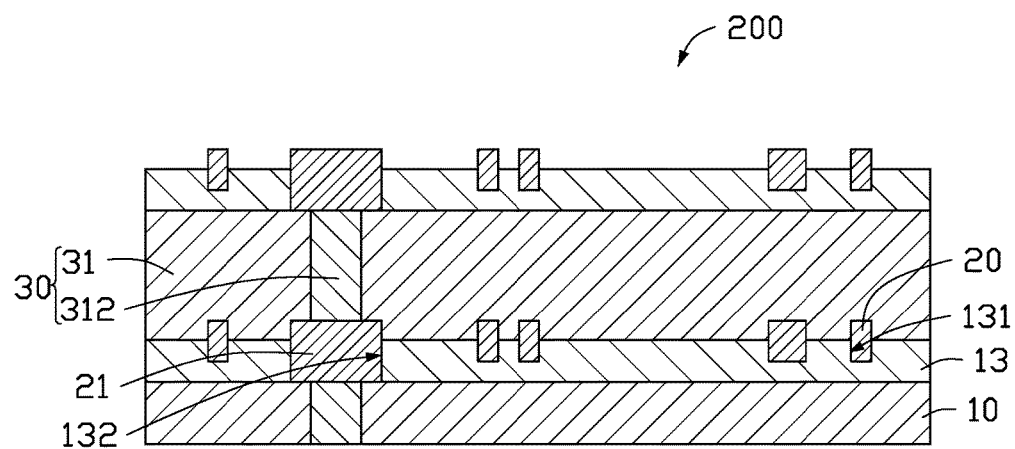
FIG. 12 is a cross-sectional view showing the two circuit board units and the intermediate layer in FIG. 11 stacked and laminated together.

Referring to FIG. 11 and FIG. 12, in another embodiment, according to a thickness requirement of the circuit board 200, at least one intermediate layer 30 is provided between the two circuit board units 100 before the two circuit board units 100 are laminated together.

The intermediate layer 30 includes a substrate layer 31 and a conductive member 312 passing through the substrate layer 31. The conductive member 312 electrically couples the electrical conductor 111 of one of the circuit board units 100 to the connecting portion 21 of a second one of the circuit board units 100.

In one embodiment, the intermediate layer 30 is obtained by defining a through hole 11 in a baseboard and filling the through hole with the electrical conductor 111 as shown in FIGS. 1-3.

The method of manufacturing the circuit board activates the LDS additive in the cover layer 13 by laser ablating the cover layer 13, so that the conductive circuit pattern 20 can be directly formed on the cover layer 13. Thus, a process of forming a seed layer is avoided, and the method is simplified.

By controlling the depth and width of the laser-etched trenches 131, a circuit having a corresponding thickness and width can be obtained, and the thickness and width of the circuit can be conveniently adjusted.

The conductive circuit pattern 20 produced by the method partially extends out of the cover layer 13, thereby facilitating compression and providing stability after press-fitting. When pressed, the connecting portion 21 is forced to press the electric conductor 111, thereby ensuring reliability of electrical connection therebetween.

Referring to FIG. 10, a circuit board 200 includes at least two circuit board units 100.

Each of the circuit board units 100 includes a baseboard 10, a cover layer 13, and a conductive circuit pattern 20. The cover layer 13 covers one side of the baseboard 10.

The baseboard 10 includes a conductive hole 12. The conductive hole 12 is filled with an electrical conductor 111.

The cover layer 13 defines trenches 131 and a opening 132. The opening 132 extends to the electrical conductor 111.

The conductive circuit pattern 20 is partially embedded in the trenches 131 and partially extends out of the trenches 131. The conductive circuit pattern 20 includes a connecting portion 21. The connecting portion 21 is embedded in the opening 132. The connecting portion 21 is in electrical communication with the electrical conductor 111.

At least two of the circuit board units 100 are stacked such that at least one of the cover layers 13 is bonded to the baseboard 10 of both circuit board units 100. Each of two ends of the connecting portion 21 of at least one of the conductive circuit patterns 20 is electrically coupled to a corresponding electrical conductor 111 to electrically couple the two adjacent circuit patterns 20.

At least one of the conductive circuit patterns 20 is embedded in the cover layer 13 of one circuit board unit 100 and the baseboard 10 of a second circuit board unit 100.

Referring to FIG. 12, in another embodiment, the circuit board 200 further includes an intermediate layer 30. The intermediate layer 30 includes a substrate layer 31 and a conductive member 312 passing through the substrate layer 31. The intermediate layer 30 is stacked between the two circuit board units 100. The conductive members 312 are electrically coupled to the electrical conductor 111 and the connecting portion 21 respectively. The intermediate layer 30 is used to increase a height of the circuit board 200. In other embodiments, the intermediate layer 30 may be omitted.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A circuit board comprising at least two circuit board units, each of the circuit board units comprising:
   a baseboard having a conductive hole filled with an electrical conductor;
   a cover layer arranged on the baseboard and defined at least one trench and at least one opening, wherein the at least one opening exposing out the electrical conductor; and
   a circuit pattern embedded in the at least one trench and comprising a connecting portion, wherein the connecting portion is embedded in the opening and is electrically coupled to the electrical conductor; and
   the at least two circuit board units are stacked, two sides of the at least one cover layer are respectively adhered to the corresponding baseboard, and two ends of the at least one connecting portion are respectively electrically coupled to the corresponding electrical conductor and electrically coupled the two adjacent circuit patterns.

2. The circuit board of claim 1, wherein at least one of the circuit patterns is embedded in the cover layer of one of the circuit board units and the baseboard of the adjacent one of the circuit board units.

3. The circuit board of claim 1 further comprising at least one intermediate layer, wherein:
   the intermediate layer comprises a substrate layer and a conductive member passing through the substrate layer;
   the at least one intermediate layer is layered between adjacent two of the circuit board units; and
   the conductive member electrically couples the electrical conductor to the connecting portion.

4. A method of manufacturing a circuit board comprising a plurality of circuit board units, the method comprising:
   providing a baseboard and defining at least one through hole in the baseboard;
   filling the at least one through hole with an electrical conductor;

covering a side of the baseboard with a cover layer, wherein the cover layer containing a laser direct structuring additive;

adhering a separation film to a side of the cover layer opposite to the baseboard;

defining at least one trench and at least one opening by laser ablation, wherein the at least one opening penetrating the separation film and the cover layer exposing out the electrical conductor;

forming a conductive circuit pattern in the at least one trench and forming a connecting portion in the at least one opening to obtain one circuit board unit;

making at least one more of the circuit board unit; and laminating at least two of the circuit board units to obtain the circuit board.

5. The method of claim 4, wherein the laser direct structuring additive comprises at least one of copper chromium oxide spinel, copper salt, copper hydroxide phosphate, copper phosphate, copper sulphate, metal oxide containing zinc, metal oxide containing copper, metal oxide containing silver, metal oxide containing gold, metal oxide containing aluminum.

6. The method of claim 4, wherein the cover layer is formed on the baseboard by coating and is bonded to the baseboard by ultraviolet curing or heat curing.

7. The method of claim 4 further comprising:
providing at least one intermediate layer comprising a substrate layer and a conductive member passing through the substrate layer; and
laminating the at least one intermediate layer between two circuit board units.

8. The method of claim 4, wherein a depth and a width of the trench correspond to a thickness and a width of a preset circuit line.

9. The method of claim 4, wherein the conductive circuit pattern is partially embedded in the cover layer and partially extends out of the cover layer.

* * * * *